(12) United States Patent
Li et al.

(10) Patent No.: US 8,125,060 B2
(45) Date of Patent: Feb. 28, 2012

(54) ELECTRONIC COMPONENT WITH LAYERED FRAME

(75) Inventors: Wu Hu Li, Singapore (SG); Heng Wan Hong, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 11/635,874

(22) Filed: Dec. 8, 2006

(65) Prior Publication Data

US 2008/0135995 A1 Jun. 12, 2008

(51) Int. Cl.
*H01L 23/495* (2006.01)

(52) U.S. Cl. ........... 257/666; 257/676; 257/E23.031

(58) Field of Classification Search ........... 257/666, 257/676, E23.031, E21.476
See application file for complete search history.

(56) References Cited

U.S. PATENT DOCUMENTS

| | | | |
|---|---|---|---|
| 4,517,252 A | 5/1985 | Hugh | |
| 5,113,239 A | 5/1992 | Cini et al. | |
| 5,165,590 A | 11/1992 | Cini et al. | |
| 6,015,858 A | 1/2000 | Gornowicz | |
| 6,201,292 B1 | 3/2001 | Yagi et al. | |
| 6,506,672 B1 | 1/2003 | Dagenais et al. | |
| 6,933,177 B2 | 8/2005 | Tellkamp | |
| 7,489,023 B2 | 2/2009 | Pape | |
| 2002/0047186 A1* | 4/2002 | Tellkamp | 257/666 |
| 2003/0052416 A1 | 3/2003 | Schendel | |
| 2003/0054995 A1 | 3/2003 | Carmeliet | |
| 2003/0111758 A1 | 6/2003 | Clark et al. | |
| 2004/0014888 A1 | 1/2004 | Fournier et al. | |
| 2005/0128864 A1 | 6/2005 | Holcomb et al. | |
| 2005/0231925 A1* | 10/2005 | Fukuda et al. | 361/760 |
| 2005/0277550 A1 | 12/2005 | Brown et al. | |
| 2005/0277740 A1 | 12/2005 | Paglia et al. | |
| 2006/0043557 A1 | 3/2006 | Saran | |
| 2006/0125062 A1* | 6/2006 | Zuniga-Ortiz et al. | 257/666 |

FOREIGN PATENT DOCUMENTS

| | | |
|---|---|---|
| DE | 10 2005 009 163 A1 | 9/2006 |
| EP | 0 081 135 | 6/1983 |
| EP | 0 128 799 | 12/1984 |
| EP | 0 716 123 | 11/1995 |
| EP | 0812 006 | 12/1997 |
| EP | 1 537 940 | 10/2004 |
| JP | 8 078849 | 3/1996 |
| JP | 2001 68497 | 3/2001 |
| JP | 200168497 | 3/2001 |
| JP | 8078849 | 3/2007 |
| WO | 9215117 | 2/1992 |
| WO | 9217618 | 10/1992 |
| WO | 9810110 | 3/1998 |
| WO | 0003092 | 1/2000 |
| WO | 0133632 | 5/2001 |
| WO | 0137019 | 5/2001 |
| WO | 0172903 | 10/2001 |
| WO | 0192342 | 12/2001 |
| WO | 0192343 | 12/2001 |

(Continued)

*Primary Examiner* — Evan Pert
*Assistant Examiner* — Selim Ahmed
(74) *Attorney, Agent, or Firm* — Dicke, Billig & Czaja, PLLC

(57) ABSTRACT

An electronic component is disclosed. In one embodiment, the electronic component includes a frame having a base layer, a first layer, a second layer including palladium placed on the first layer, and a third layer including gold placed on the second layer. A semiconductor chip is positioned on the frame.

18 Claims, 1 Drawing Sheet

FOREIGN PATENT DOCUMENTS

| | | |
|---|---|---|
| WO | 0208335 | 1/2002 |
| WO | 0212620 | 2/2002 |
| WO | 02103425 | 12/2002 |
| WO | 03035757 | 5/2003 |
| WO | 03035759 | 5/2003 |
| WO | 03035764 | 5/2003 |
| WO | 03102071 | 12/2003 |
| WO | 2005026081 | 3/2005 |
| WO | 2005027228 | 3/2005 |
| WO | 2005027996 | 3/2005 |
| WO | 2005053043 | 6/2005 |
| WO | 2005066282 | 7/2005 |
| WO | 2005080491 | 9/2005 |
| WO | 2005090517 | 9/2005 |

* cited by examiner

ELECTRONIC COMPONENT WITH LAYERED FRAME

BACKGROUND

This application relates to an electronic component.

An electronic component typically includes a valence crystal such as silicon whose electrical conductivity depends significantly on temperature and the presence of minute amounts of foreign impurities such as boron.

For these and other reasons there is a need for the present invention.

SUMMARY

One embodiment provides an electronic component. The electronic component includes a frame having a base layer, a first layer, a second layer including palladium placed on the first layer, and a third layer including gold placed on the second layer, a semiconductor chip is positioned on the frame.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, there is provided an electronic component with a lead frame, which includes a die paddle and a plurality of lead fingers. A semiconductor chip is placed on the die paddle. The semiconductor chip is connected to the lead frame by one or more gold bond wires and by one or more aluminum bond wires. The gold bond wires comprise either gold material or an alloy of gold material whilst the aluminum bond wires comprise either pure aluminum material or an alloy of aluminum material.

The lead frame includes a base layer of copper material or an alloy of copper material or an alloy of iron material. A first layer of nickel material or an alloy of nickel material is provided on the base layer of the lead frame. A second layer of palladium material or an alloy of palladium material is provided on the first layer. A third layer of gold material or an alloy of gold material is provided on the second layer. The first, second and third layers provide bonding between the gold bonding wires and the lead frame and between the aluminum bonding wires and the lead frame. The first layer, second layer and the third layer respectively covering at least the bond-wire attachment area on the lead frame.

A method of producing the electronic component includes providing a leadframe having a base layer of copper or alloy of iron. A first layer of nickel is positioned on the base layer of copper or alloy of iron. On the first layer of nickel is positioned the second layer of palladium. The third layer of gold is positioned on the second layer of palladium. A semiconductor chip is placed on a die paddle of the lead frame. One or more gold bond wires are attached between the semiconductor chip and a bond-wire attachment area on the lead frame and one or more aluminum bond wires are attached between the semiconductor chip and a bond-wire attachment area on the lead frame.

The following description of the embodiments is exemplary in nature and is not intended to limit the device, application, or uses.

Figure 1:
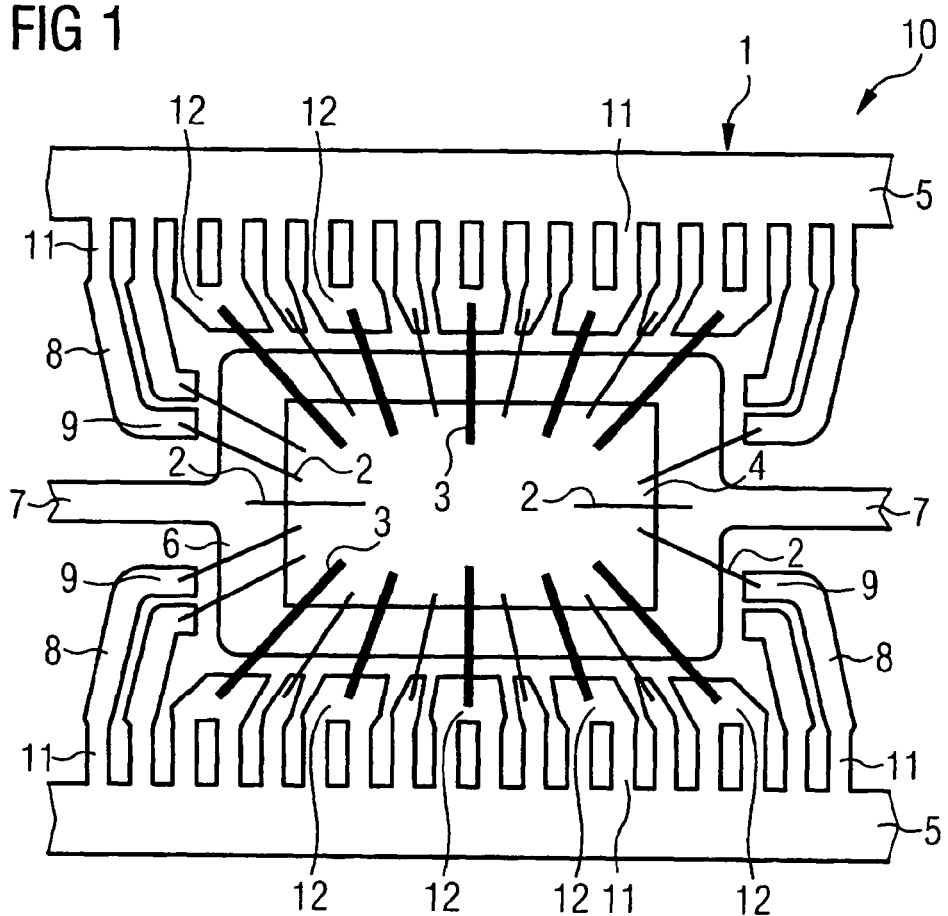
FIG. 1 illustrates a simplified top view of a lead frame assembly.

FIG. 1 illustrates a simplified top view of a lead frame assembly 10. The lead frame assembly 10 also known as electronic component includes a lead frame 1 and includes a plurality of lead fingers 8 and a die paddle 6. On the die paddle 6 is placed a semiconductor chip 4. The lead frame 1 is part of a lead frame strip, which includes a plurality of lead frames 1 but is not shown in the figure.

Each lead finger 8 includes an inner segment 9 that is provided at the inner end of the lead finger 8 and an outer segment 11 that is provided at the outer end of the lead finger 8. A metal strip 5 is provided next to the outer segments 11. A metal tie bar 7 is provided between the adjacent die paddles 6 to secure the adjacent die paddles 6.

The semiconductor chip 4 is bonded to the die paddle 6 by a layer of chip adhesive, which is not illustrated. The semiconductor chip 4 comprises electronic circuits and contact pads that are connected to the electronic circuits. The contact pads and electronic circuits are not shown in the figure. Either a first or a second bond wire 2 or 3 electrically connects the lead finger 8 to the contact pad while the die paddle 6 is attached to the contact pad by the first bond wire 2. A metal link 12 is provided between the lead finger 8 that is attached to the second bond wire 3 and an adjacent lead finger 8.

In a further embodiment, the die paddle 6 is attached to the contact pad by either the second bond wire 3 or the first bond wire 2 and the second bond wire 3.

The first end of the first bond wire 2 has a shape of a partial ball and is connected to the contact pad of the semiconductor chip 4. The first end is attached to the contact pad by a means known as ball bonding. The second end of the first bond wire 2 has a shape of a wedge and is attached to either the inner segment 9 of the lead finger 8 or the die paddle 6. The second end is attached to the inner segment 9 by a means known as wedge bonding. The first end of the second bond wire 3 has a shape of a wedge and is connected to the contact pad of the semiconductor chip 4 by wedge bonding. The second end of the second bond wire 3 has a shape of wedge and is connected to the inner segment 9 of the lead finger 8 by the wedge bonding. The first bond wire 2 has a diameter of about 50 μm (micrometers) and comprises gold material while the second bond wire 3 has a diameter of about 250 μm and comprises aluminium material. The first bond wire 2 and the second bond wire 3 are not limited to the above dimensions but can have any diameter.

During application, the lead fingers 8 are separated and removed from the metal strip 5 and are attached to an external substrate such as a printed circuit board. The outer segment 11 act as terminals for the transmission of electrical signals between the external substrate and the semiconductor chip 4. The electrical signals comprise high current signals and control signals. The control signals are channelled to the lead fingers 8 via the first bond wires 2 while the high current signals are transmitted to the lead fingers 8 via the second bond wires 3. The two adjacent lead fingers 8 that are attached to the second bond wire 3 support the transmission of the high current signal. The die paddle 6 provides electrical grounding for the semiconductor chip 4 through the first bond wires 2.

The above information about the signals on the different wires is given for illustration only. In other embodiments not illustrated here, the high current signals can also be channelled via the first bond wires 2 and the control signals can be channelled via the second bond wires 3.

The first bond wire 2 comprises gold material, which provides fast and easy connection of the first bond wire 2 to the lead finger 8 and to the contact pad of the semiconductor chip 4. However, the size of the first bond wire 2 is small and not suitable for transmitting high current signals. Gold is usually costly. Increasing the size of the first bond wire 2 to transmit high current would significantly increase the cost of producing the lead frame assembly 10. In contrast, the second bond wire 3 comprises aluminium material, which is usually less costly than gold material. The second bond wire 3 is sufficiently large to transmit a high current signal without the high cost associated with gold material. However, the properties of the aluminium material do not provide for a fast connection of the second bond wire 3 from the lead finger 8 to the contact pad. Thus, the use of first and second bond wires 2 and 3 within an electronic component offer the chip designer an opportunity to harvest the advantage of each bond wire type.

The die paddle 6 provides an attachment area for the semiconductor chip 4 and dissipates heat generated by the semiconductor chip 4 when it is operational.

In a later process of package encapsulation, an encapsulation compound covers the semiconductor chip 4, part of the lead fingers 8, first and second bond wires 2 and 3, and the die paddle 6. The encapsulation compound is in a molten state during package encapsulation. It flows within a mould cavity and exerts a shifting force on the lead fingers 8 and the die paddle 6. The metal strip 5 fixes the lead fingers 8 and the metal tie bar 7 fastens the die paddle 6 against the shifting force. After package encapsulation, the metal strips 5 and the metal tie bars 7 are separated and removed from the lead frame 1. The encapsulated package is also known as a finished electronic component. In user application, the electronic component is placed on wiring structure such as printed circuit board.

Figure 2:
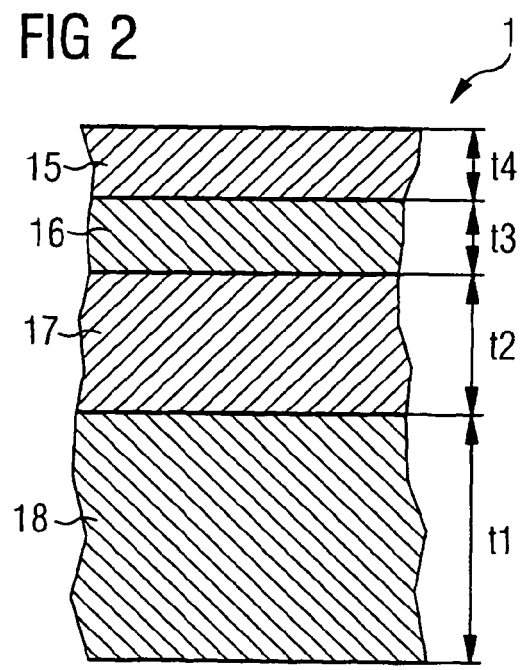
FIG. 2 illustrates a cross-sectional view of the lead frame of FIG. 1.

FIG. 2 illustrates a cross-sectional view of the lead frame 1 of FIG. 1. The lead frame 1 includes a base metal 18. On the base metal 18 is placed a first layer 17. On the first layer 17 is provided a second layer 16. On top surface of the second layer 16 is placed a third layer 15.

The third layer 15 comprises gold material whereas the second layer 16 includes palladium material. The palladium material in the second layer 16, the gold material in the third layer 15 and the nickel material in the first layer 17 provide bonding between the lead finger 8 and the first bond wire 2 and between the lead finger 8 and the second bond wire 3.

The first layer 17 comprises nickel material. The nickel material oxidises easily but the gold material in the third layer 15 and the palladium material in the second layer 16 inhibit such oxidation. The nickel material acts as a barrier against the migration of copper material in the base metal 18 to the gold material in the third layer 15. The tendency for migration to occur is particularly so at high temperature, which the lead frame 1 experiences during the production of the electronic component.

The base metal 18 includes copper material or alloy of iron such as alloy 42, which provides good electrical conductivity but easily oxidises when exposed. However, the gold material in the third layer 15 and the palladium material in the second layer 16 inhibit this oxidation.

The base metal 18 has a thickness t1 that ranges from about 0.1 to 1.0 mm (millimeter) whereas the first layer 17 has a thickness t2 that ranges from 0.1 to 4 μm (micrometer). The second layer 16 has a thickness t3 that ranges from 1 to 2000 nm (nanometer) whilst the third layer 15 has a thickness t4 that also ranges from 1 to 1000 nm. The first layer 17 has a typical thickness t2 that ranges from 0.5 to 4 μm. The second layer 16 has a typical thickness t3 that ranges from 200 to 2000 nm whilst the third layer 15 has a typical thickness t4 that also ranges from 200 to 1000 nm. If the thickness of either t3 or t4 is less than 1 nm, the bonding between the lead finger 8 and the first or second bond wire 2 and 3 may not be reliable. Should the thicknesses t3 exceed 2000 nm or t4 exceed 1000 nm, the cost of the first and second layers 17 and 16 may be generally excessive. If the thickness t2 of the first layer 17 is less than 0.1 μm, it may not be able to inhibit the migration of copper material in the base metal 18 to the gold material in the third layer 15. The above dimensions are given for purpose of illustration and can also be different in other embodiments.

The first, second and third layers 17, 16 and 15 cover the whole lead frame 1. In another embodiment, the first, second and third layers 17, 16 and 15 cover only the wire attachment area of the lead frame 1, which are the inner segment 9 of the lead finger 8 and the die paddle 6. The first, second and third layers 17, 16 and 15 enable both the first and second bond wires 2 and 3 to be attached to the lead frame 1. This is unlike conventional covering on the lead frame 1 that enables only either the first bond wire 2 or the second bond wire 3 to be attached to the lead frame 1.

A method of producing the lead frame assembly 10 includes the provision of the base metal 18. Then, the base metal 18 is either etched or punched by machine to form the shape of the lead frame 1.

After this, the first layer 17 of nickel is coated onto the base metal 18 by an electroplating process. The electroplating process comprises a chemical reaction with the use of an external electrical potential. Then, in a similar electroplating process the first layer 17 is coated with the second layer 16 of palladium. Following this, the second layer 16 is coated with the third layer 15 of gold by an electroplating process. During the electroplating processes listed above the base metal 18 is cleaned by a means such as dipping in an acid bath before each process of coating.

After this, the semiconductor chip 4 is placed over the die paddle 6 of the lead frame 1. Then, the first bond wires 2 attach the inner segment 9 of the lead finger 8 or the die paddle 6 to the contact pad of the semiconductor chip 4 and the die paddle 6 to the contact pad of the semiconductor chip 4 by application of thermo-sonic energy. Likewise, the second bond wires 3 attach the inner segment 9 of the lead finger 8 to the contact pad of the semiconductor chip 4 and the die paddle 6 to the contact pad of the semiconductor chip 4 by application of ultrasonic energy.

An alternative method of producing the lead frame assembly 10 comprises the provision of the base metal 18. Then, the base metal 18 is either etched or punched by machine to form the shape of the lead frame 1.

After this, the first layer 17 of nickel is coated onto the base metal 18 by an electroless process. The electroless process comprises a chemical reaction without the use of an external electrical potential. The base metal 18 is provided with a catalyzed surface. Then, the base metal 18 is placed in a solution of positively charged nickel ions. A reducing agent in the solution donates electrons to the positively charged nickel ions. This reduces the nickel atoms and promotes the deposition of the nickel atoms onto the catalyzed surface of the lead frame 1. Then, in a similar electroless process the first layer 17 is coated with the second layer 16 of palladium.

Following this, the second layer 16 is coated with the third layer 15 of gold by an immersion process. The immersion process uses a chemical displacement means to deposit a layer of gold onto the lead frame 1 while displacing the palladium ions that is present in the second layer 16.

Then, the semiconductor chip 4 is placed over the die paddle 6 of the lead frame 1. After this, the first bond wires 2 attach the inner segment 9 of the lead finger 8 or the die paddle 6 to the contact pad of the semiconductor chip 4 and the die paddle 6 to the contact pad of the semiconductor chip 4 by application of thermo-sonic energy. Likewise, the second bond wires 3 attach the inner segment 9 of the lead finger 8 to the contact pad of the semiconductor chip 4 and the die paddle 6 to the contact pad of the semiconductor chip 4 by application of ultrasonic energy.

In a further embodiment, an electronic device comprises one or more electronic components, which are provided on a wiring structure such as printed circuited board.

In an embodiment a leadframe 1 is provided which comprises a die paddle 6 and a plurality of leadfingers 8 comprising bond-wire attachment areas 9, wherein the leadframe 1 comprises a base layer 18 of copper material or an alloy of copper material or an alloy of iron material 1 and wherein the bond-wire attachment areas comprise a first layer 17 of nickel material or an alloy of nickel material positioned on the base layer 18, a second layer 16 of palladium material or an alloy of palladium material positioned on the first layer 17 and a third layer 15 of gold material or an alloy of gold material positioned on the second layer 16.

A semiconductor chip 4 is attached to the die paddle 6 of the lead frame 1. One or more first bond wires 2 comprising gold are attached between the semiconductor chip 4 and a bond-wire attachment 9 area on the lead frame 1 and one or more second bond wires 3 comprising aluminum are attached between the semiconductor chip 4 and the bond-wire attachment area 9 on the lead frame 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component comprising:
    a frame comprising a base layer and a layered structure disposed thereon, including on an upper surface of the frame, the layered structure including a first layer placed on the base layer, a second layer including palladium placed on the first layer, and a third layer including gold placed on the second layer;
    a semiconductor chip positioned on the third layer on the upper surface of the frame; and
    a plurality of bonding wires, including gold bonding wires and aluminum bonding wires, electrically connecting the semiconductor chip to the frame, the bonding wires being directly bonded to the third layer.

2. The component of claim 1, comprising:
    where the first layer is made of nickel or a nickel alloy.

3. The component of claim 2, comprising:
    where the base layer is a metal layer.

4. The component of claim 3, comprising where the metal layer is made of copper or a copper alloy.

5. The component of claim 3, comprising where the metal layer is made of iron or an iron alloy.

6. The component of claim 1, comprising the lead frame including a die paddle, wherein the semiconductor chip is positioned on the die paddle.

7. The component of claim 1, comprising where the semiconductor chip is attached to the lead frame via one or more bond wires.

8. The component of claim 7, comprising where the bond wires include one or more gold bond wires and one or more aluminum bond wires.

9. The electronic component of claim 1, wherein the first, second, and third layers cover the entire frame.

10. The electronic component of claim 1, wherein all surfaces of the frame are coated with the first layer, the second layer, and the third layer.

11. An electronic component comprising:
    a lead frame having a die paddle and a plurality of lead fingers including bond-wire attachment areas, the lead frame comprising:
        a base layer of copper material or an alloy of copper material or an alloy of iron material;
        a first layer of nickel material or an alloy of nickel material is provided on the base layer, the first layer covering at least the bond-wire attachment areas on the lead frame:
        a second layer of palladium material or an alloy of palladium material is provided on the first layer, the second layer covering at least the bond-wire attachment areas on the lead frame; and
        a third layer of gold material or an alloy of gold material is provided on the second layer, the third layer covering at least the bond-wire attachment areas on the lead frame;
    a semiconductor chip arranged on the die paddle; and
    one or more first bond wires and one or more second bond wires extending between the lead fingers and the semiconductor chip and being directly bonded to the third layer covering the bond-wire attachment areas, the first bond wires comprising a gold material or an alloy of gold material and the second bond wires comprising an aluminum material or an alloy of aluminum material.

12. The component according to claim 11, comprising wherein the first layer has thickness that is in the range between 0.1 and 4 micrometers.

13. The component of claim 12, comprising wherein the second layer has thickness that is in the range between 1 and 2000 nanometers.

14. The component of claim 13, comprising wherein the third layer has a thickness that is in a range between 1 and 1000 nanometers.

15. The component of claim 14, comprising wherein the first bond wires form ball bonds on the semiconductor chip and wedge bonds on the bond-wire attachment area on the lead frame.

16. The component of claim 15, wherein the second bond wires form wedge bonds on the semiconductor chip and wedge bonds on the bond-wire attachment area on the lead frame.

17. An electronic device comprising:
at least one electronic component having a frame comprising a base layer, a first layer placed on the base layer, a second layer including palladium placed on the first layer, and a third layer including gold placed on the second layer, the first, second and third layers, beginning with the first layer, being successively placed at least on an upper surface of the frame, a semiconductor chip positioned on the frame, and a plurality of bonding wires, including gold bonding wires and aluminum bonding wires, electrically connected the semiconductor chip to the frame and being directly bonded to the third layer on the upper surface; and
wherein the electronic component is provided on a wiring structure.

18. An electronic component comprising:
a lead frame, the lead frame comprising a die paddle and a plurality of lead fingers;
a semiconductor chip placed on the die paddle;
one or more first bond wires extending between lead fingers and the semiconductor chip;
one or more second bond wires extending between lead fingers and the semiconductor chip; and
wherein the first bond wires comprise gold material or an alloy of gold material, the second bond wires comprise aluminum material or an alloy of aluminum material; and
the lead frame comprises a base layer of copper material or an alloy of copper material or alloy of iron material, a first layer of nickel material or an alloy of nickel material is provided on the base layer, the first layer covering at least a bond-wire attachment area on the lead frame and having a thickness that is in the range between 0.1 and 4 micrometers, a second layer of palladium material or an alloy of palladium material is provided on the first layer, the second layer covering at least the bond-wire attachment area on the lead frame and having a thickness that is in the range between 1 and 2000 nanometers, and a third layer of gold material or an alloy of gold material is provided on the second layer, the third layer covering at least the bond-wire attachment area on the lead frame and having a thickness that is in the range between 1 and 1000 nanometers, wherein the one or more first bond wires and the one or more second bond wires are directly bonded to the third layer at the bond-wire attachment areas of the lead frame.

* * * * *